(12) United States Patent
Minemura

(10) Patent No.: US 11,239,161 B2
(45) Date of Patent: Feb. 1, 2022

(54) SEMICONDUCTOR MEMORY DEVICE

(71) Applicant: KIOXIA CORPORATION, Tokyo (JP)

(72) Inventor: Yoichi Minemura, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 30 days.

(21) Appl. No.: 16/808,211

(22) Filed: Mar. 3, 2020

(65) Prior Publication Data
US 2020/0388566 A1 Dec. 10, 2020

(30) Foreign Application Priority Data

Jun. 4, 2019 (JP) .............................. JP2019-104765

(51) Int. Cl.
| | | |
|---|---|---|
| *H01L 23/528* | (2006.01) | |
| *H01L 27/11524* | (2017.01) | |
| *H01L 27/11556* | (2017.01) | |
| *H01L 27/11529* | (2017.01) | |
| *H01L 27/11582* | (2017.01) | |
| *H01L 27/11573* | (2017.01) | |

(Continued)

(52) U.S. Cl.
CPC ........ *H01L 23/528* (2013.01); *H01L 23/5226* (2013.01); *H01L 27/1157* (2013.01); *H01L 27/11514* (2013.01); *H01L 27/11524* (2013.01); *H01L 27/11529* (2013.01); *H01L 27/11551* (2013.01); *H01L 27/11556* (2013.01); *H01L 27/11573* (2013.01); *H01L 27/11578* (2013.01); *H01L 27/11582* (2013.01); *H01L 27/11597* (2013.01); *G11C 16/26* (2013.01)

(58) Field of Classification Search
CPC ......... H01L 27/11514; H01L 27/11551; H01L 27/11578; H01L 27/11597; H01L 27/11524; H01L 27/11556; H01L 27/11529; H01L 27/11582; H01L 27/11573; H01L 27/1157; H01L 27/11575; H01L 27/11565; H01L 23/528; H01L 23/5226; G11C 16/26; G11C 16/0483
See application file for complete search history.

(56) References Cited

U.S. PATENT DOCUMENTS 8,933,502 B2 * 1/2015 Higashitani ....... H01L 23/53209
257/326
9,859,207 B2 * 1/2018 Kim ........................ H01L 28/00
(Continued)

*Primary Examiner* — Galina G Yushina
(74) *Attorney, Agent, or Firm* — Kim & Stewart LLP

(57) ABSTRACT

A memory device includes a semiconductor layer including adjacent cell and non-cell areas in a first direction, first and second conductive lines on the layer, extending along the first direction and arranged away from each other in a second direction crossing the first direction, conductor layers arranged above the semiconductor layer in a third direction crossing the first and second directions, pillars on the cell area, passing through the conductor layers in the third direction and forming memories at intersections with the conductor layers, and shunt lines extending along the second direction and arranged in the first direction above the cell area, each of the shunt lines connected to the first and second lines via third conductive lines. A length between the shunt line closest to the non-cell area and a boundary between the cell and non-cell areas is less than a length between adjacent shunt lines.

20 Claims, 11 Drawing Sheets

(51) Int. Cl.
*H01L 23/522* (2006.01)
*H01L 27/11578* (2017.01)
*H01L 27/11551* (2017.01)
*H01L 27/11514* (2017.01)
*H01L 27/11597* (2017.01)
*H01L 27/1157* (2017.01)
*G11C 16/26* (2006.01)

(56) References Cited

U.S. PATENT DOCUMENTS

| | | | |
|---|---|---|---|
| 2012/0098050 A1* | 4/2012 | Shim | H01L 27/11578 |
| | | | 257/324 |
| 2015/0325303 A1 | 11/2015 | Hashimoto et al. | |
| 2016/0079250 A1* | 3/2016 | Akutsu | H01L 21/743 |
| | | | 257/326 |
| 2018/0053768 A1* | 2/2018 | Kim | H01L 27/11575 |
| 2018/0261616 A1* | 9/2018 | Cho | H01L 27/11582 |
| 2019/0115358 A1* | 4/2019 | Lee | H01L 27/11519 |

* cited by examiner

SEMICONDUCTOR MEMORY DEVICE

CROSS-REFERENCE TO RELATED APPLICATION(S)

This application is based upon and claims the benefit of priority from Japanese Patent Application No. 2019-104765, filed on Jun. 4, 2019, the entire contents of which are incorporated herein by reference.

FIELD

Embodiments described herein relate generally to a semiconductor memory device.

BACKGROUND

A NAND-type flash memory capable of storing data in a non-volatile manner has been known.

DETAILED DESCRIPTION

Figure 1:
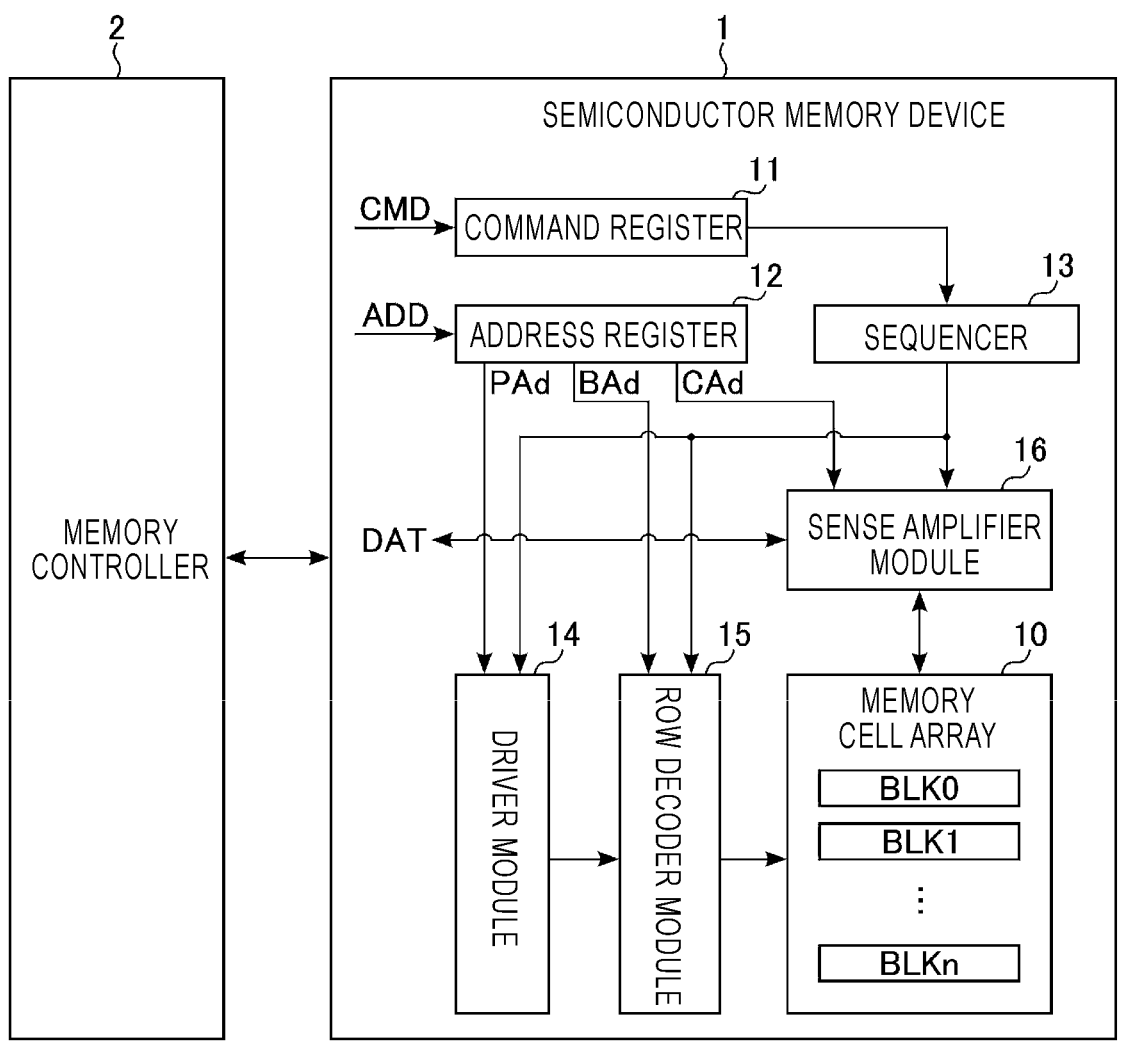
FIG. 1 is a block diagram illustrating a configuration of a semiconductor memory device according to an embodiment.

Embodiments of the present disclosure improve the reliability of data stored in the semiconductor memory device.

In general, according to one embodiment, a semiconductor memory device includes a semiconductor layer including a cell area and a non-cell area adjacent to the cell area in a first direction parallel to a surface of the semiconductor layer, first and second conductive lines on the semiconductor layer, extending along the first direction and arranged away from each other in a second direction parallel to the surface of the semiconductor layer and crossing the first direction, a plurality of first conductor layers arranged above the semiconductor layer in a third direction crossing both the first and second directions, a plurality of pillars on the cell area, each of which passes through the first conductor layers in the third direction and forms a plurality of memory cells, one of the memory cells formed at an intersection of the pillar with one of the first conductor layers, and a plurality of shunt lines extending along the second direction and arranged in the first direction above the cell area, each of the shunt lines electrically connected to each of the first and second conductive lines via one or more third conductive lines. A first length between one of the shunt lines closest to the non-cell area and a boundary between the cell and non-cell areas in the first direction is less than a second length between two of the shunt lines that are adjacent to each other.

Hereinafter, embodiments will be described with reference to drawings. Each embodiment exemplifies an apparatus or a method for embodying the technical idea of the embodiment. The drawings are schematic or conceptual, and it cannot be said that the dimensions, ratios, etc. of each drawing are necessarily the same as actual ones. The technical idea of the embodiment is not specified by the shapes, structures, arrangements, etc. of constitutional elements.

In the following description, constitutional elements having substantially the same functions and configurations are denoted by the same reference numerals. The figure after the letters constituting a reference numeral is referenced by a reference numeral including the same letters, and is used to distinguish between elements having similar configurations. When there is no need to distinguish between elements indicated by reference numerals including the same letters, each of these elements is referenced by the reference numeral including only the letters.

[1] Embodiments

Hereinafter, a semiconductor memory device 1 according to an embodiment will be described.

[1-1] Configuration of Semiconductor Memory Device 1

[1-1-1] Entire Configuration of Semiconductor Memory Device 1

FIG. 1 illustrates a configuration of a semiconductor memory device 1 according to the embodiment. The semiconductor memory device 1 is a NAND-type flash memory capable of storing data in a non-volatile manner, and may be controlled by an external memory controller 2.

As illustrated in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer of more than or equal to 1). The block BLK is a set of a plurality of memory cells capable of storing data in a non-volatile manner, and is used as, for example, a unit of data erasure. In the memory cell array 10, a plurality of bit lines and a plurality of word lines are provided. Each memory cell is associated with, for example, one bit line and one word line. A detailed configuration of the memory cell array 10 will be described below.

The command register 11 stores a command CMD received by the semiconductor memory device 1 from the memory controller 2. The command CMD includes, for example, instructions that cause the sequencer 13 to execute a read operation, a write operation, an erase operation, etc.

The address register 12 stores address information ADD received by the semiconductor memory device 1 from the memory controller 2. The address information ADD includes, for example, a block address BAd, a page address PAd, and a column address CAd. For example, the block address BAd, the page address PAd, and the column address CAd are used to select a block BLK, a word line, and a bit line, respectively.

The sequencer 13 controls the entire operation of the semiconductor memory device 1. For example, the sequencer 13 controls the driver module 14, the row decoder module 15, the sense amplifier module 16, etc. on the basis of the command CMD stored in the command register 11 to execute a read operation, a write operation, an erase operation, etc.

The driver module 14 generates a voltage used for a read operation, a write operation, an erase operation, etc. Then, the driver module 14 applies the generated voltage to a signal line corresponding to a selected word line on the basis of, for example, the page address PAd stored in the address register 12.

The row decoder module 15 selects one block BLK in the corresponding memory cell array 10 on the basis of the block address BAd stored in the address register 12. Then, the voltage applied to the signal line corresponding to the selected word line, is applied to the selected word line in the selected block BLK.

The sense amplifier module 16 applies a desired voltage to each bit line according to write data DAT received from the memory controller 2, during a write operation. During a read operation, the sense amplifier module 16 determines data stored in a memory cell on the basis of the voltage of the bit line, and transmits the determination result as read data DAT to the memory controller 2.

The semiconductor memory device 1 and the memory controller 2 as described above may make up one semiconductor device through a combination thereof. Examples of such a semiconductor device may include a memory card such as an SDTM card, and a solid state drive (SSD).

[1-1-2] Circuit Configuration of Memory Cell Array 10

Figure 2:
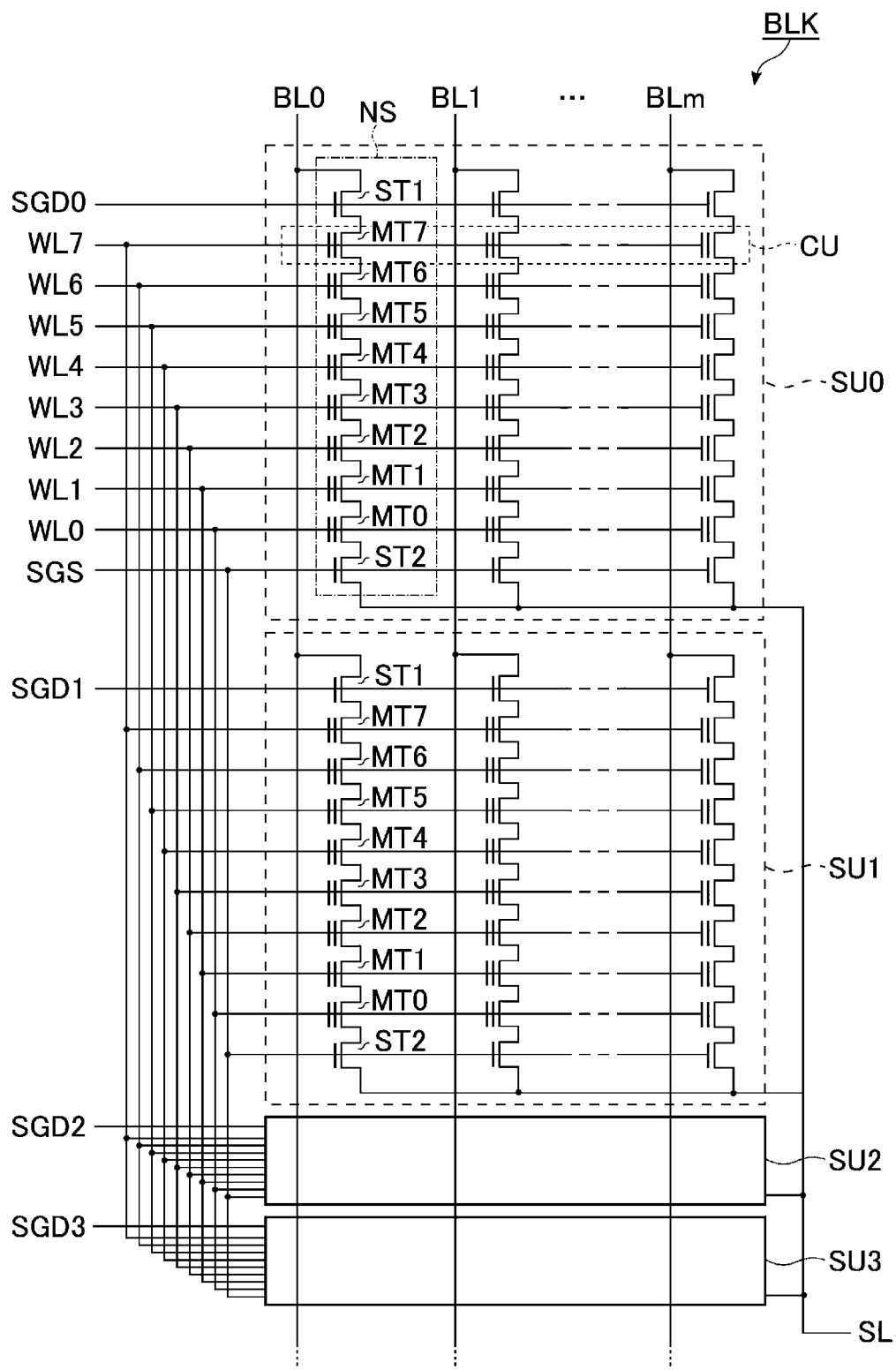
FIG. 2 is a circuit diagram illustrating a circuit configuration of a memory cell array in the semiconductor memory device according to the embodiment.

FIG. 2 illustrates a circuit configuration of the memory cell array 10 in the semiconductor memory device 1 according to the embodiment, in which one block BLK among a plurality of blocks BLK in the memory cell array 10 is extracted. As illustrated in FIG. 2, the block BLK includes, for example, four string units SU0 to SU3.

Each string unit SU includes a plurality of NAND strings NSs associated with bit lines BL0 to BLm (m is an integer of more than or equal to 1). Each NAND string NS includes, for example, memory cell transistors MT0 to MT7, and select transistors ST1 and ST2. The memory cell transistor MT includes a control gate and a charge storage layer, and stores data in a non-volatile manner. Each of the select transistors ST1 and ST2 is used to select the string unit SU at the time of various operations.

In each NAND string NS, the memory cell transistors MT0 to MT7 are connected in series. A drain of the select transistor ST1 is connected to the associated bit line BL, and a source of the select transistor ST1 is connected to one end of the memory cell transistors MT0 to MT7 connected in series. A drain of the select transistor ST2 is connected to the other end of the memory cell transistors MT0 to MT7 connected in series. A source of the select transistor ST2 is connected to a source line SL.

In the same block BLK, the control gates of the memory cell transistors MT0 to MT7 are connected to word lines WL0 to WL7, respectively, in common. Gates of the select transistors ST1 in the string units SU0 to SU3 are connected to select gate lines SGD0 to SGD3, respectively, in common. Gates of the select transistors ST2 are connected to a select gate line SGS in common.

In the above-described circuit configuration of the memory cell array 10, the bit line BL is shared by NAND strings NSs to which the same column address is assigned, in the respective string units SU. The source line SL is shared among, for example, the plurality of blocks BLK.

A set of the plurality of memory cell transistors MTs connected to the common word line WL in one string unit SU is referred to as, for example, a cell unit CU. For example, the storage capacity of the cell unit CU including the memory cell transistors MTs each of which stores 1-bit data is defined as "one page data." The cell unit CU may have a storage capacity of two or more pages of data according to the number of bits of data stored in the memory cell transistor MT.

The circuit configuration of the memory cell array 10 in the semiconductor memory device 1 according to the embodiment is not limited to the above-described configuration. For example, each NAND string NS may include any number of memory cell transistors MTs and any number of select transistors ST1 and ST2. Each block BLK may include any number of string units SU.

[1-1-3] Structure of Memory Cell Array 10

Hereinafter, the structure of the memory cell array 10 according to the embodiment will be described.

In the drawings to be referred to below, the X direction corresponds to the extension direction of a word line WL, the Y direction corresponds to the extension direction of a bit line BL, and the Z direction corresponds to a direction perpendicular to the surface of a semiconductor substrate used as a semiconductor layer in which the semiconductor memory device 1 is formed. In the plan view, hatching is added to make the drawing easy to see. The hatching added to the plan view is not necessarily related to the material or the characteristic of an element to which the hatching is added. In the present specification, in order to make the drawing easy to see, elements such as wiring and contacts are omitted.

(Planar Layout of Memory Cell Array 10)

Figure 3:
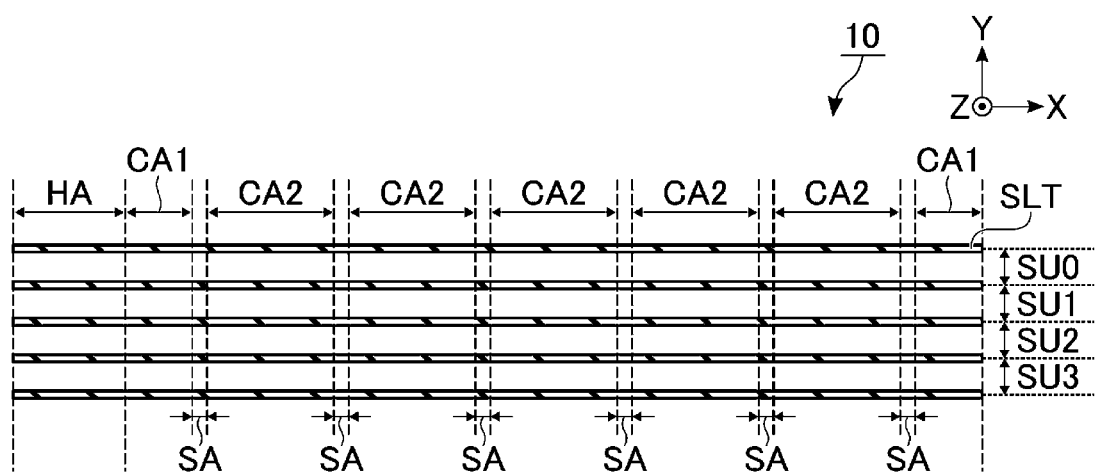
FIG. 3 is a plan view illustrating a planar layout of the memory cell array in the semiconductor memory device according to the embodiment.

FIG. 3 shows a planar layout of the memory cell array 10 in the semiconductor memory device 1 according to the embodiment, in which an area corresponding to one block BLK (i.e., the string units SU0 to SU3) is extracted for illustration purpose. As illustrated in FIG. 3, the memory cell array 10 includes a plurality of slits SLTs. The planar layout of the memory cell array 10 is divided into, for example, a plurality of cell areas CAs, a lead area HA, and a plurality of shunt areas SAs in the X direction.

Each of the plurality of slits SLTs is provided extending along the X direction, and crosses the memory cell array 10 in the X direction. The plurality of slits SLTs are arranged in the Y direction. The slit SLT has a structure in which an insulating member and a conductive member are embedded, and divides conductor layers which are provided in the same wiring layer and are adjacent to each other through the corresponding slit SLT. Specifically, the slit SLT divides, for example, a plurality of wiring layers corresponding to the word lines WL0 to WL7, and the select gate lines SGD and SGS.

The cell area CA is an area where the NAND strings NSs are formed. Among the plurality of cell areas CAs, two cell areas CAs disposed at both ends in the X direction are called cell areas CA1, and cell areas CAs disposed between the two cell areas CA1 are called cell areas CA2. That is, the two cell areas CA1 are disposed at one end portion and the other end portion, respectively, in the X direction, among the plurality of cell areas CAs arranged in the X direction, and the plurality of cell areas CA2 are sandwiched between the two cell areas CA1.

The lead area HA is an area where contacts for electrically connecting the word lines WLs and the select gate lines SGS and SGD connected to the NAND strings NSs, to the row decoder module 15, are formed. The lead area HA is disposed at one end portion of the memory cell array 10 in the X direction, and is adjacent to the cell area CA1. The lead area HA may be disposed at both one end portion and the other end portion of the memory cell array 10 in the X direction.

Figure 9:
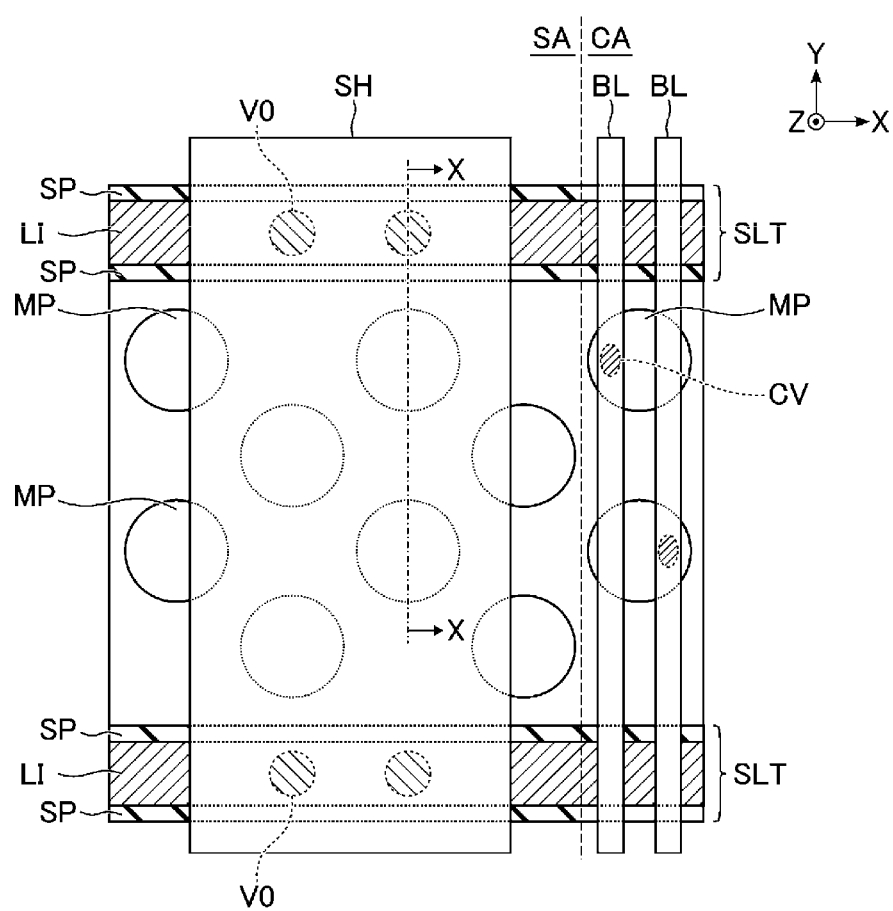
FIG. 9 is a plan view illustrating a detailed planar layout in a shunt area of the memory cell array in the semiconductor memory device according to the embodiment.

The shunt area SA is an area where a shunt line SH illustrated in FIG. 9 is formed. The shunt line SH is a wiring that has, for example, a portion extending in parallel to the bit lines BLs, and a short-circuit between conductor members provided inside each of the plurality of slits SLTs. In each of the plurality of shunt areas SAs, at least one shunt line SH is provided. Each of the plurality of shunt areas SAs is disposed between the adjacent cell areas CA1 and CA2, and between the two adjacent cell areas CA2.

In the above-described planar layout of the memory cell array 10 in the embodiment, each area separated by the slits SLTs corresponds to one string unit SU. That is, in this example, the string units SU0 to SU3 each extending in the X direction are arranged in the Y direction. Then, in the memory cell array 10, for example, the layout illustrated in FIG. 3 is repeatedly disposed in the Y direction.

(Structure of Memory Cell Array 10 in Cell Area CA)

Figure 4:
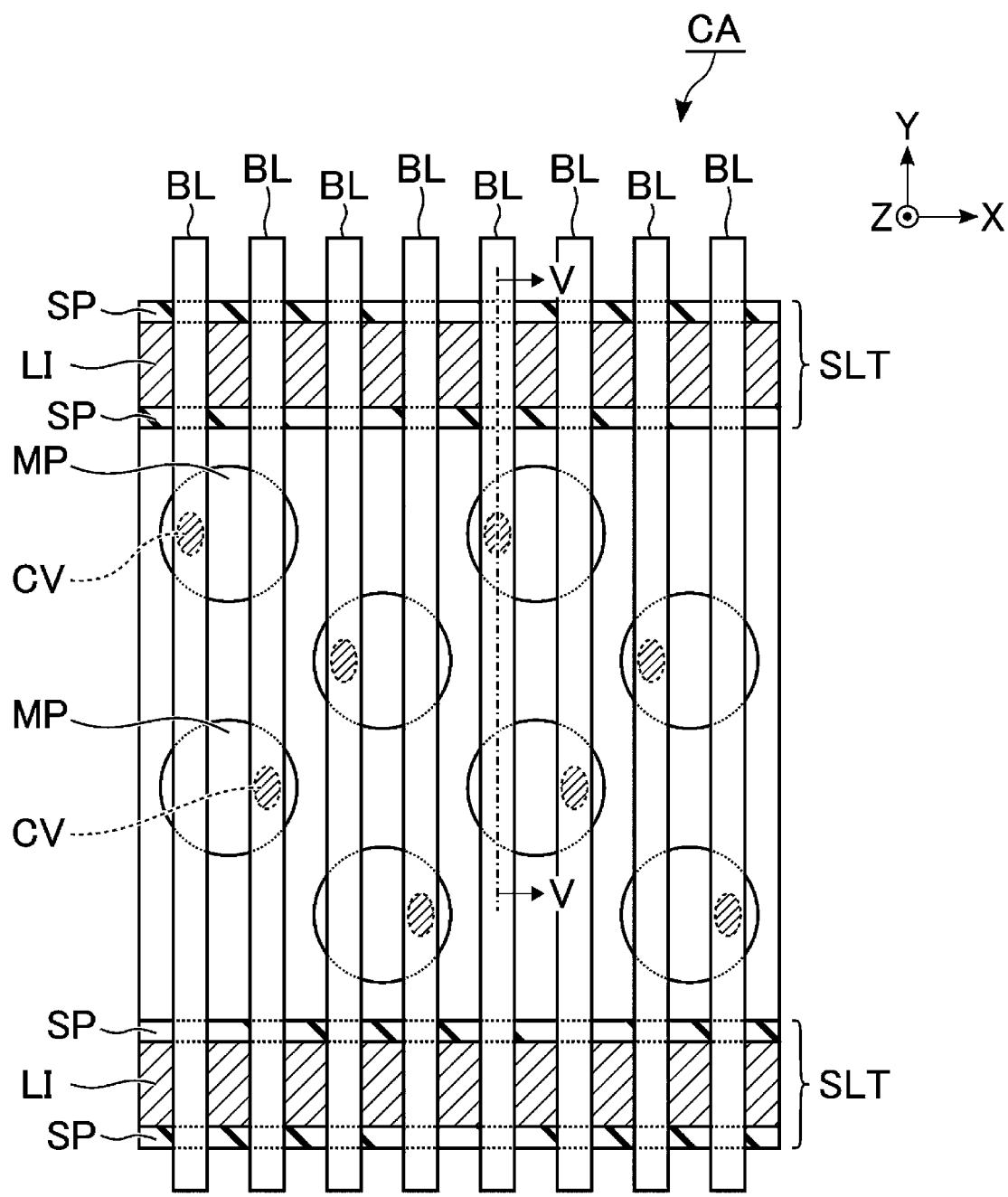
FIG. 4 is a plan view illustrating a detailed planar layout in a cell area of the memory cell array in the semiconductor memory device according to the embodiment.

FIG. 4 shows a detailed planar layout of the memory cell array 10 in the cell area CA of the semiconductor memory device 1 according to the embodiment, in which a part of an area corresponding to one string unit SU is extracted for illustration purpose. As illustrated in FIG. 4, in the cell area CA, the memory cell array 10 includes a plurality of memory pillars MPs, a plurality of contacts CVs, and a plurality of bit lines BLs. The slit SLT includes a contact LI and a spacer SP.

Each of the memory pillars MPs functions as, for example, one NAND string NS. The plurality of memory pillars MPs are disposed in, for example, four columns of staggered patterns in an area between two adjacent slits SLTs. The embodiment is not limited thereto, and the number and arrangement of the memory pillars MPs between the two adjacent slits SLTs may be properly changed.

The plurality of bit lines BLs are arranged in the X direction, in which at least a part of each of the bit lines BLs extends in the Y direction. Each bit line BL is disposed to overlap at least one memory pillar MP in each string unit SU. In this example, two bit lines BLs are disposed to overlap each memory pillar MP. The contact CV is provided between one bit line BL among the plurality of bit lines BLs overlapping the memory pillar MP, and the corresponding memory pillar MP. Each memory pillar MP is electrically connected to the corresponding bit line BL via the contact CV. In each space separated by the slits SLTs, one contact CV is connected to one bit line BL.

In each slit SLT, at least a part of the contact LI is provided extending in the X direction. The spacer SP is provided on the side surface of the contact LI. The contact LI and the plurality of wiring layers adjacent to the slit SLT are insulated from each other by the spacer SP. The contact LI is used as the source line SL. The contact LI may be a semiconductor or a metal. As for the spacer SP, an insulator such as silicon oxide ($SiO_2$) or silicon nitride (SiN) is used.

Figure 5:
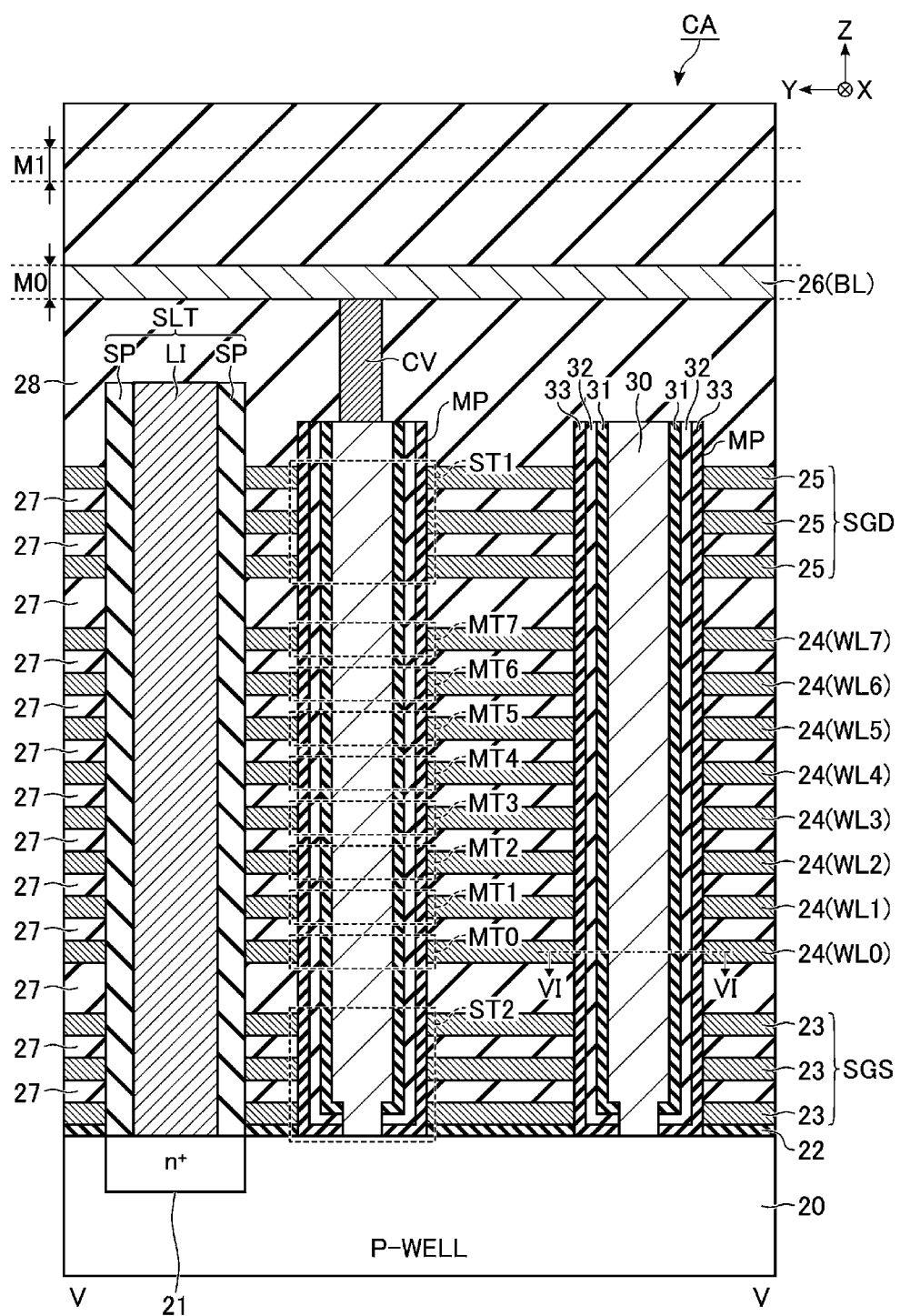
FIG. 5 is a sectional view taken along the V-V line of FIG. 4, which illustrates a sectional structure in the cell area in the memory cell array in the semiconductor memory device according to the embodiment.

FIG. 5 is a sectional view taken along the V-V line in FIG. 4, and illustrates a sectional structure in the cell area CA of the memory cell array 10 in the semiconductor memory device 1 according to the embodiment. As illustrated in FIG. 5, the memory cell array 10 further includes a P-type well region 20, an insulator layer 22, and conductor layers 23 to 26.

The P-type well region 20 is provided near the surface of the semiconductor substrate, and includes an N-type semiconductor region 21. The N-type semiconductor region 21 is an N-type impurity diffusion region provided near the surface of the P-type well region 20. The N-type semiconductor region 21 is doped with, for example, phosphorous (P).

The insulator layer 22 is provided on the P-type well region 20. The conductor layer 23 and an insulator layer 27 are alternately stacked on the insulator layer 22. The conductor layer 23 is formed in, for example, a plate shape spreading along the XY plane. The plurality of stacked conductor layers 23 are used as the select gate line SGS. The conductor layer 23 contains, for example, tungsten (W).

The conductor layer 24 and the insulator layer 27 are alternately stacked on the uppermost conductor layer 23. The conductor layer 24 is formed in, for example, a plate shape spreading along the XY plane. The plurality of stacked conductor layers 24 are used as the word lines WL0 to WL7 in order from the P-type well region 20 side. The conductor layer 24 contains, for example, tungsten (W).

The conductor layer 25 and the insulator layer 27 are alternately stacked on the uppermost conductor layer 24. The conductor layer 25 is formed in, for example, a plate shape spreading along the XY plane. The plurality of stacked conductor layers 25 are used as the select gate line SGD. The conductor layer 25 contains, for example, tungsten (W).

The conductor layer 26 is provided above the uppermost conductor layer 25, via an insulator layer 28. The conductor layer 26 is formed in, for example, a line shape extending in the Y direction, and is used as the bit line BL. That is, the plurality of conductor layers 26 are arranged along the X direction in an area (not illustrated). The conductor layer 26 contains, for example, copper (Cu).

Each memory pillar MP is provided extending along the Z direction, and passes through the insulator layer 22, the conductor layers 23 to 25, and the insulator layers 27. The bottom of the memory pillar MP is in contact with the P-type well region 20. Each memory pillar MP includes, for example, a semiconductor layer 30, a tunnel insulating film 31, an insulating film 32, and a block insulating film 33.

The semiconductor layer 30 is provided extending along the Z direction. For example, the upper end of the semiconductor layer 30 is provided in a layer upper than the uppermost conductor layer 25, and the lower end of the semiconductor layer 30 is in contact with the P-type well region 20. The tunnel insulating film 31 covers the side surface of the semiconductor layer 30. The insulating film 32 covers the side surface of the tunnel insulating film 31. The block insulating film 33 covers the side surface of the insulating film 32. Each of the tunnel insulating film 31 and the block insulating film 33 contains, for example, silicon oxide ($SiO_2$) The insulating film 32 contains, for example, silicon nitride (SiN).

A columnar contact CV is provided on the semiconductor layer 30 in the memory pillar MP. In the illustrated area, a contact CV corresponding to one memory pillar MP of two memory pillars MPs is illustrated. The contact CV corresponding to the other memory pillar MP is not illustrated in FIG. 5.

One conductor layer 26, that is, one bit line BL is in contact with the upper surface of the contact CV. As described above, in each space separated by the slits SLTs, one contact CV is connected to one conductor layer 26 (i.e., one bit line BL). That is, to each conductor layer 26, one memory pillar MP between two adjacent slits SLTs is electrically connected. Hereinafter, a wiring layer in which the conductor layer 26 (i.e., the bit line BL) is provided is called a wiring layer M0, and one wiring layer provided in a layer upper than the wiring layer M0 is called a wiring layer M1.

The slit SLT is formed in, for example, a plate shape spreading along the XZ plane, and divides the insulator layer 22, the conductor layers 23 to 25, and the insulator layers 27. The upper end of the slit SLT is provided in a layer between the uppermost conductor layer 25 and the conductor layer 26. The lower end of the slit SLT is in contact with the N-type semiconductor region 21 in the P-type well region 20. Specifically, the contact LI in the slit SLT is formed in a plate shape spreading along the XZ plane. The bottom of the contact LI is electrically connected to the N-type semiconductor region 21. The spacer SP in the slit SLT covers the side surface of the contact LI. The contact LI is separated from each of the conductor layers 23 to 25, and the insulator layer 27 by the spacer SP.

Figure 6:
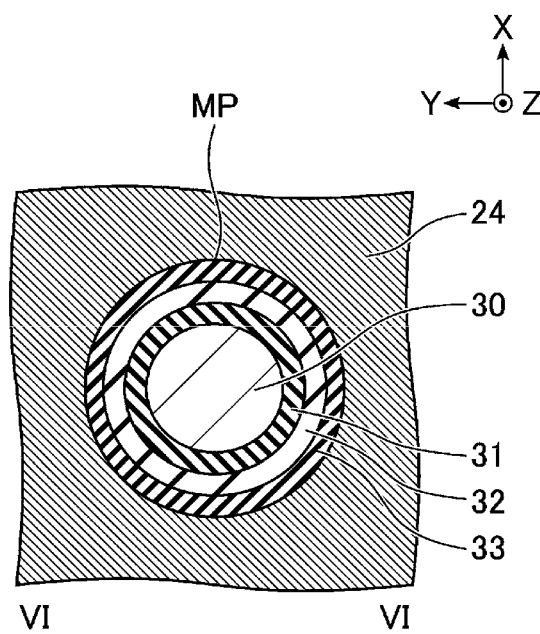
FIG. 6 is a sectional view taken along the VI-VI line of FIG. 5, which illustrates a sectional structure of a memory pillar in the semiconductor memory device according to the embodiment.

FIG. 6 is a sectional view taken along the VI-VI line of FIG. 5, and illustrates a sectional structure of the memory pillar MP in the semiconductor memory device 1 according to the embodiment. More specifically, FIG. 6 illustrates a sectional structure of the memory pillar MP in a layer that is parallel to the surface of the semiconductor substrate (i.e., the P-type well region 20) and includes the conductor layer 24. As illustrated in FIG. 6, in the layer including the conductor layer 24, the semiconductor layer 30 is provided in, for example, the central portion of the memory pillar MP. The tunnel insulating film 31 surrounds the side surface of the semiconductor layer 30. The insulating film 32 surrounds the side surface of the tunnel insulating film 31. The block insulating film 33 surrounds the side surface of the insulating film 32. The conductor layer 24 surrounds the side surface of the block insulating film 33.

In the above-described structure of the memory pillar MP, a portion where the memory pillar MP and the conductor layers 23 intersect functions as the select transistor ST2. A portion where the memory pillar MP and the conductor layer 24 intersect functions as the memory cell transistor MT. A portion where the memory pillar MP and the conductor layers 25 intersect functions as the select transistor ST1. That is, the semiconductor layer 30 functions as a channel for each of the memory cell transistors MT0 to MT7 and the select transistors ST1 and ST2. The insulating film 32 functions as a charge storage layer of the memory cell transistor MT.

(Structure of Memory Cell Array 10 in Lead Area HA)

Figure 7:
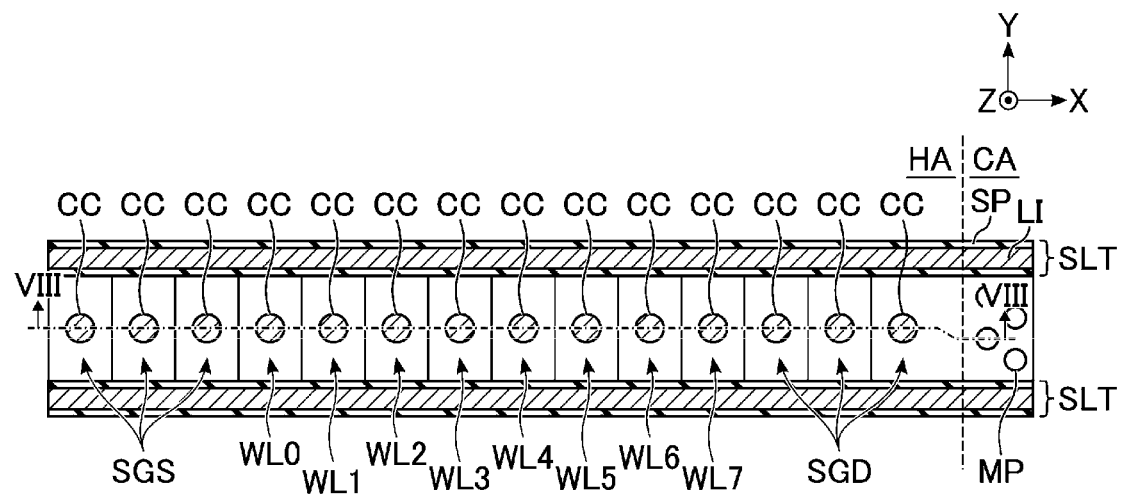
FIG. 7 is a plan view illustrating a detailed planar layout in a lead area of the memory cell array in the semiconductor memory device according to the embodiment.
Figure 8:
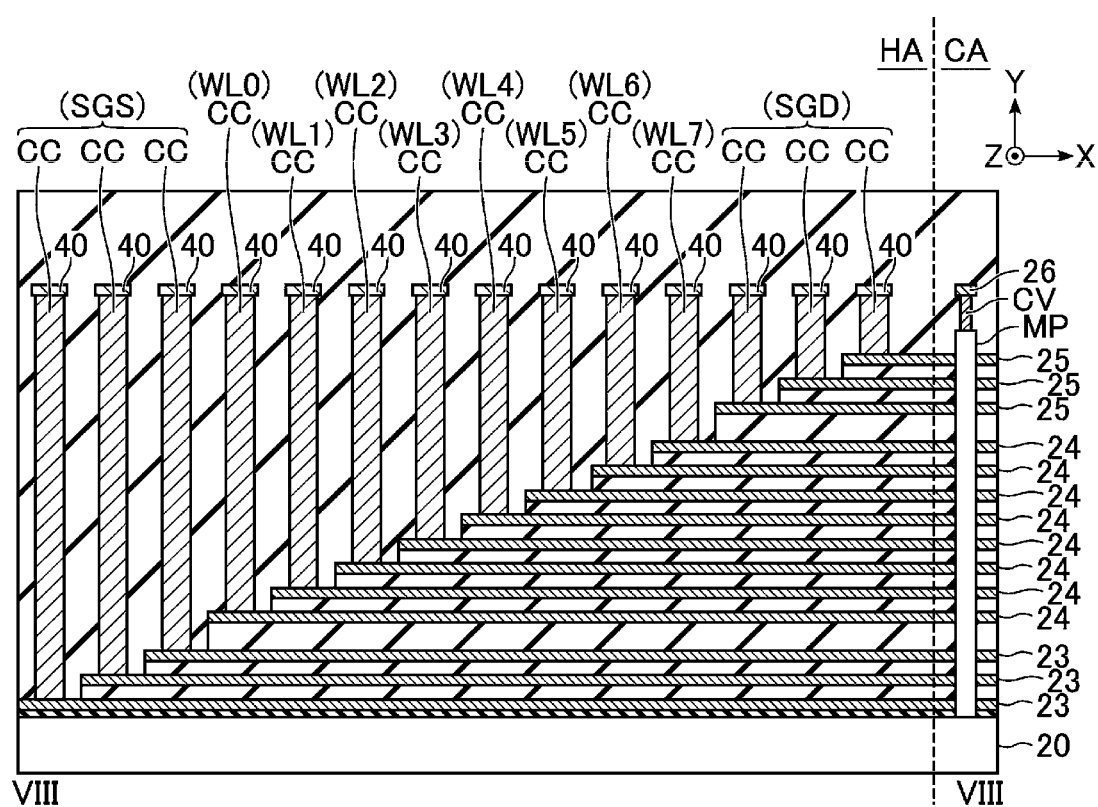
FIG. 8 is a sectional view taken along the VIII-VIII line of FIG. 7, which illustrates a sectional structure in the lead area of the memory cell array in the semiconductor memory device according to the embodiment.

FIG. 7 shows a detailed planar layout of the memory cell array 10 in the lead area HA of the semiconductor memory device 1 according to the embodiment, in which an area corresponding to one string unit SU is extracted in the illustration. FIG. 7 also illustrates a part of the cell area CA in the vicinity of the lead area HA. FIG. 8 is a sectional view taken along the VIII-VIII line of FIG. 7. As illustrated in FIG. 7 and FIG. 8, in the lead area HA, each of the select gate line SGS, the word lines WL0 to WL7, and the select gate line SGD has a portion (hereinafter called "terrace portion") at the end portion thereof, which does not overlap the upper wiring layer (i.e., the conductor layer). The shape of the portion not overlapping the upper wiring layer has a shape like a step, a terrace, or a rimstone. In the lead area HA, the memory cell array 10 further includes a plurality of contacts CCs.

Specifically, steps are formed between the select gate line SGS and the word line WL0, between the word line WL0 and the word line WL1, . . . , between the word line WL6 and the word line WL7, and between the word line WL7 and the select gate line SGD. The end portion of each of the select gate line SGS, the word lines WL0 to WL7, and the select gate line SGD is disposed between two adjacent slits SLTs. The structure of the slit SLT in the lead area HA is the same as that in the cell area CA.

Each of the plurality of contacts CCs is disposed at the terrace portion of each of the select gate line SGS, the word lines WL0 to WL7, and the select gate line SGD. That is, the plurality of contacts CCs are electrically connected to the word lines WL0 to WL7 and the select gate lines SGD and SGS, respectively. Then, each of the word lines WL0 to WL7 and the select gate lines SGD and SGS is electrically connected to the row decoder module 15 via the corresponding contact CC.

FIG. 8 illustrates a sectional structure in the lead area HA of the memory cell array 10 in the semiconductor memory device 1 according to the embodiment. As illustrated in FIG. 8, in the lead area HA, the end portions of the plurality of conductor layers corresponding to the word lines WLs and the select gate lines SGD and SGS are provided in a stepwise form. In the lead area HA, the memory cell array 10 further includes a plurality of conductor layers 40.

Specifically, one contact CC is provided on each of the terrace portions of the plurality of conductor layers 23 corresponding to the select gate line SGS, the plurality of conductor layers 24 corresponding to the word lines WL0 to WL7, and the plurality of conductor layers 25 corresponding to the select gate line SGD. One conductor layer 40 is provided on each contact CC, and the corresponding contact CC and the conductor layer 40 are electrically connected to each other. The conductor layer 40 is provided in the same layer (i.e., the wiring layer M0) as, for example, the conductor layer 26.

The configuration of the memory cell array 10 in the lead area HA is not limited to that described above. For example, steps may be formed in the end portions of the stacked word lines WLs and select gate lines SGD and SGS, in the Y direction. The end portions of the stacked word lines WLs and select gate lines SGD and SGS in the lead area HA may have a stepwise form having any number of columns. The formed step structure may vary among the select gate line SGS, the word lines WLs, and the select gate line SGD. The conductor layer 40 and the conductor layer 26 may be provided in different layers.

(Structure of Memory Cell Array 10 in Shunt Area SA)

FIG. 9 shows a detailed planar layout of the memory cell array 10 in the shunt area SA of the semiconductor memory device 1 according to the embodiment, in which a part of an area corresponding to one string unit SU is extracted for illustration purpose. FIG. 9 also illustrates a part of the cell area CA in the vicinity of the shunt area SA. As illustrated in FIG. 9, in the shunt area SA, the memory cell array 10 further includes the shunt line SH, a plurality of contacts V0, and a plurality of memory pillars MPs.

The shunt line SH is provided extending in the Y direction, and the line width of the shunt line SH is thicker than the line width of the bit line BL. The shunt line SH intersects with the plurality of slits SLTs. For example, two contacts V0 are provided between the contact LI in each slit SLT and the shunt line SH. Then, the contact LI in each slit SLT and the shunt line SH are electrically connected to each other via the two contacts V0.

As in the cell area CA, the plurality of memory pillars MPs are disposed in, for example, four columns of staggered patterns in an area between two adjacent slits SLTs. Then, for example, the contact CV is not connected to the memory pillar MP disposed in the shunt area SA. The embodiment is not limited thereto as long as the memory pillar MP is not connected to the shunt line SH provided in the upper layer via a contact on the memory pillar MP.

Figure 10:
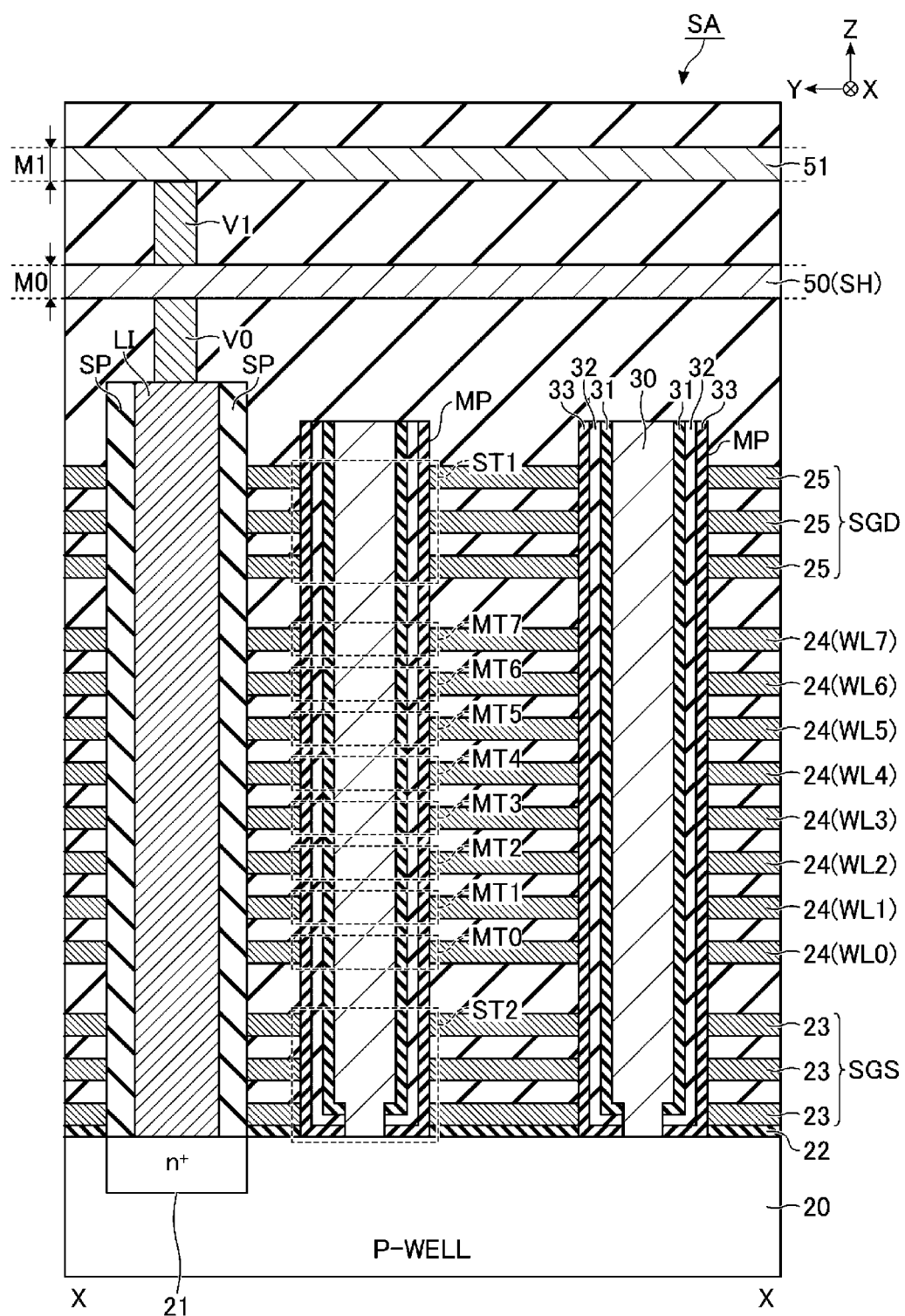
FIG. 10 is a sectional view taken along the X-X line of FIG. 9, which illustrates a sectional structure in the shunt area of the memory cell array in the semiconductor memory device according to the embodiment.

FIG. 10 is a sectional view taken along the X-X line of FIG. 9, and illustrates a sectional structure in the shunt area SA of the memory cell array 10 in the semiconductor memory device 1 according to the embodiment. As illustrated in FIG. 10, the memory cell array 10 in the shunt area SA has a structure where, for example, the conductor layer 26 and the contact CV are omitted, and conductor layers 50 and 51, and contacts V0 and V1 are added in the structure of the memory cell array 10 in the cell area CA described using FIG. 5.

Each of the conductor layers 50 and 51 is formed in, for example, a line shape extending in the Y direction. The conductor layers 50 and 51 are provided in the wiring layers M0 and M1, respectively. Each of the conductor layers 50 and 51 contains, for example, copper (Cu). The line widths of the conductor layers 50 and 51 may be different from each other.

The contact V0 is provided between the conductor layer 50 and the contact LI, and connects the corresponding conductor layer 50 to the contact LI. The contact V1 is provided between the conductor layers 50 and 51, and connects the conductor layers 50 and 51. For example, the contact V1 is disposed above the contact V0.

In the semiconductor memory device 1 according to the embodiment, for example, the conductor layer 50 corresponds to the shunt line SH. The embodiment is not limited thereto, and the set of the conductor layers 50 and 51 may be called the shunt line SH. In FIG. 10, the contact V1 is disposed above the contact V0 at the same position in the Y direction, while the positions of the contacts V0 and V1 in the Y direction may vary. Regardless of the number of contacts V0, any number of the contacts V1 may be formed.

In the semiconductor memory device 1 according to the embodiment, when a voltage is applied to the lowermost conductor layer 23, a current path is formed between the contact LI and the semiconductor layer 30 in the memory pillar MP in the vicinity of the surfaces of the P-type well region 20 and the N-type semiconductor region 21. Accordingly, the semiconductor memory device 1 may cause a current to flow between the bit line BL and the shunt line SH through the memory pillar MP. That is, the shunt line SH functions as a part of the source line SL connected to the NAND string NS.

Figure 11:
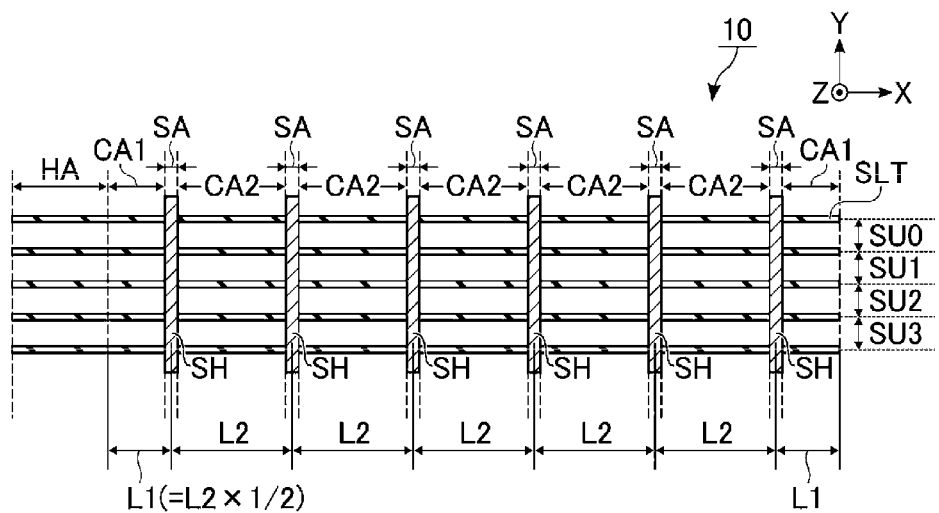
FIG. 11 is a plan view illustrating a planar layout of shunt lines in the memory cell array in the semiconductor memory device according to the embodiment.

FIG. 11 is a planar layout of the shunt lines SHs in the memory cell array 10 in the semiconductor memory device 1 according to the embodiment, and illustrates the arrangement of the shunt lines SHs in the planar layout of the memory cell array 10 illustrated in FIG. 3. In this example, it is assumed that one shunt line SH is disposed in each shunt area SA. As illustrated in FIG. 11, in the semiconductor memory device 1 according to the embodiment, the width of the cell area CA separated by the shunt areas SAs on the end portion side of the memory cell array 10 is different from that in the middle portion of the memory cell array 10.

Specifically, in the semiconductor memory device 1 according to the embodiment, the cell area CA1 is disposed between the end portion of the memory cell array and the shunt line SH provided on the end portion side of the memory cell array 10. That is, the plurality of memory pillars MPs are disposed between the end portion of the memory cell array 10 and the shunt line SH provided on the end portion side of the memory cell array 10.

Then, in the semiconductor memory device 1 according to the embodiment, the shunt line SH is not connected to a part of the contact LI located at the end portion of the memory cell array 10. That is, at the outside of the area where the cell area CA and the shunt area SA are disposed, for example, the columnar contact and the shunt line SH are not connected to the contact LI.

In the semiconductor memory device 1 according to the embodiment, an interval between the shunt line SH disposed on the end portion side, and the end portion of the cell area CA1 adjacent to the corresponding shunt line SH is about half an interval between two adjacent shunt lines SHs. That is, the interval between the shunt line SH disposed on the end portion side on one side in the X direction, and the end portion on one side in the X direction in the cell area CA1 adjacent to the corresponding shunt line SH is about half the interval between the two adjacent shunt lines SHs. Similarly, an interval between the shunt line SH disposed on the end portion side on the other side in the X direction, and the end portion on the other side in the X direction in the cell area CA1 adjacent to the corresponding shunt line SH is about half an interval between the two adjacent shunt lines SHs.

Furthermore, in other words, an interval L1 in the X direction between a boundary between the cell area CA1 and the lead area HA, and the center line of the shunt line SH in the X direction adjacent to the corresponding cell area CA1 is about half an interval L2 in the X direction between the center lines of two adjacent shunt lines SHs. An interval L1 in the X direction between the end portion of the cell area CA1 away from the lead area HA, and the center line of the shunt line SH in the X direction adjacent to the corresponding cell area CA1 is about half an interval L2 in the X direction between the center lines of two adjacent shunt lines SHs. The interval L1 only has to be shorter than the interval L2, and it is desirable that the following condition is satisfied:

$$L1 = L2 \times \tfrac{1}{2}.$$

The configuration of the memory cell array 10 in the shunt area SA is not limited to that described above. For example, the number of the contacts V0 provided between the shunt line SH and the contact LI in each slit SLT is not limited to two, and may be any number. At least one contact V0 needs to be provided between each shunt line SH and the contact LI in each slit SLT. When a plurality of shunt lines SHs are provided in each shunt area SA, the line widths of the shunt lines SHs may not be constant.

[1-2] Effect of Embodiment

According to the above-described semiconductor memory device 1 according to the embodiment, it is possible to improve the reliability of data stored in the semiconductor memory device 1. Hereinafter, the detailed effect of the semiconductor memory device 1 according to the embodiment will be described by using a Comparative Example.

In the semiconductor memory device in which the memory cell transistors MTs are three-dimensionally stacked, for example, a stacked wiring including the select gate line SGS, the word lines WLs, and the select gate line SGD are provided on the semiconductor substrate including the P-type well region 20. Then, the memory pillar MP is provided through the stacked wiring, and is connected to the P-type well region 20 including the N-type semiconductor region 21. In the semiconductor memory device, when a voltage is applied to, for example, the lowermost select gate line SGS, a current path is formed between the semiconductor layer 30 (i.e., channel) in the memory pillar MP, and the conductor layer 50 (i.e., shunt line SH) connected to the contact LI on the N-type semiconductor region 21.

In a read operation of the semiconductor memory device, current flowing through the plurality of memory pillars MPs in each cell area CA flows into the shunt line SH, that is, the source line SL via a nearby contact LI. In the read operation, the voltage of the source line SL may vary according to the total amount of current flowing into the source line SL. For example, the total amount of the current flowing into the source line SL may vary according to the number of bit lines BLs to be charged in the read operation, or the arrangement of the memory pillars MPs and the contacts LI. When the voltage of the source line SL is changed in the read operation, the threshold voltage of the memory cell transistor MT appears to be changed according to the voltage of the source line SL.

In a write operation of the semiconductor memory device, a verify read-out is executed. The verify read-out is a read operation for checking whether the threshold voltage of the memory cell transistor MT has reached a desired voltage. In the write operation, the semiconductor memory device can save power consumption by changing the number of bit lines BLs to be charged at the time of the verify read-out, according to the progress of the write operation. When such a write operation is executed, a difference in the total amount of current flowing into the source line SL may occur between the read operation and the verify operation.

Figure 12:
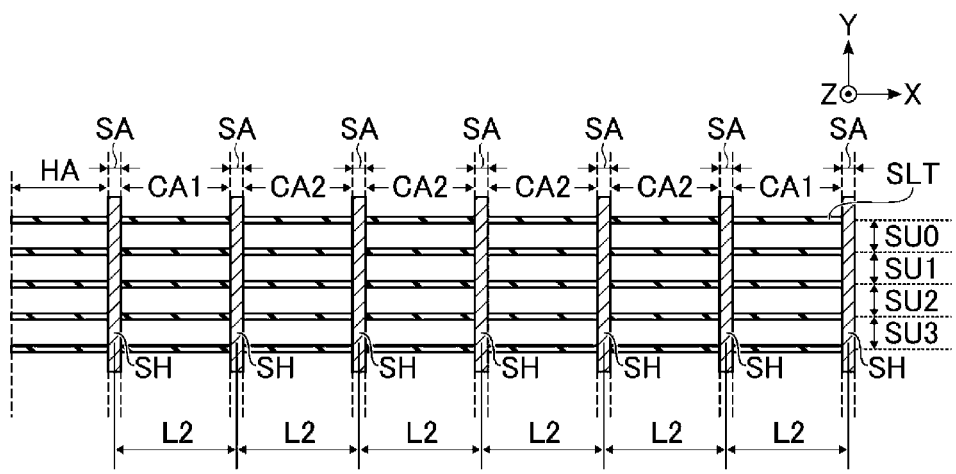
FIG. 12 is a plan view illustrating a planar layout of shunt lines in a memory cell array in a semiconductor memory device according to a Comparative Example.

FIG. 12 illustrates a planar layout of shunt lines SHs in a memory cell array in a semiconductor memory device according to a Comparative Example. The area illustrated in FIG. 12 corresponds to the same area as in FIG. 11, and will be described by using the same reference numerals. As illustrated in FIG. 12, in the semiconductor memory device according to the Comparative Example, cell areas CA1 and CA2 are disposed between two shunt lines SHs at both ends in the X direction.

That is, in the Comparative Example, the cell area CA1 disposed on the end portion side is sandwiched between shunt areas SAs. Then, in the Comparative Example, the width of the cell area CA1 in the X direction is substantially the same as the width of the cell area CA2 in the X direction. That is, in the Comparative Example, the cell areas CAs are separated by the shunt areas SAs, and have the same widths at the end portion side of the memory cell array, and at the middle portion of the memory cell array.

For example, in the Comparative Example, current flows into the shunt lines SHs provided in each of the shunt areas SAs disposed at both ends in the X direction, mainly via memory pillars MPs in one adjacent cell area CA1. Meanwhile, current flows into the shunt lines SHs provided in each of the shunt areas disposed between the shunt areas SAs at both ends, mainly via memory pillars MPs in two adjacent cell areas CAs. In the cell area CA sandwiched between two shunt lines SHs, the half of the total amount of current flowing through the memory pillars MPs in the corresponding cell area CA flows into one side shunt line SH, and the other half of the total amount of current flowing through the memory pillars MPs in the corresponding cell area CA flows into the other side shunt line SH. That is, in the Comparative Example, the total amount of current flowing into each of the shunt lines SHs at both ends is smaller than that in each of other shunt lines SHs.

Thus, in the Comparative Example, since a wiring resistance between the contact LI and the shunt line SH is the same, a voltage change amount between the read operation and the verify operation is larger in the source line SL corresponding to other shunt lines SHs than in the source line SL corresponding to the shunt lines SHs at both ends. When the voltage change amount of the source line SL between the read operation and the verify operation varies according to regions, in the entire memory cell array 10, a variation of the threshold voltage of the memory cell transistor MT increases, and a distribution of the threshold voltage is widened. As a result, there is a concern that erroneous reading may occur in the read operation, and thus the reliability of data stored in the semiconductor memory device may be reduced.

In contrast, in the semiconductor memory device 1 according to the embodiment, each of the shunt areas SAs at both ends is disposed between the cell areas CA1 and CA2, and the shunt areas SAs on end portion sides of the memory cell array 10 are omitted. Then, in the semiconductor memory device 1 according to the embodiment, the width of each of the cell areas CA1 disposed at both ends among the plurality of cell areas CAs is designed to be, for example, about half the width of each of other cell areas CA2.

For example, in the semiconductor memory device 1 according to the embodiment, current flows into the shunt lines SHs provided in each of the shunt areas SAs at both ends, mainly via memory pillars MPs in two adjacent cell areas CA1 and CA2. Then, in each of the read operation and the verify read-out in the embodiment, a difference between the total amount of current flowing into each of the shunt lines SHs disposed at both ends, and the total amount of current flowing into the shunt line SH sandwiched between the cell areas CA2 is smaller than that in the Comparative Example.

As a result, the semiconductor memory device 1 according to the embodiment can reduce the voltage change amount of the source line SL in the read operation and the verify read-out from varying according to regions, and may narrow the width of a distribution of the threshold voltage of the memory cell transistor MT. Therefore, the semiconductor memory device 1 according to the embodiment can prevent erroneous reading, thereby improving the reliability of stored data.

[1-3] Modifications of Embodiment

The above-described effect in the semiconductor memory device 1 according to the embodiment may be also achieved by changing the arrangement, etc. of the shunt line SH or the contact V0. Hereinafter, each of the first modification of the embodiment, and the second modification of the embodiment will be described in order.

(First Modification of Embodiment)

Figure 13:
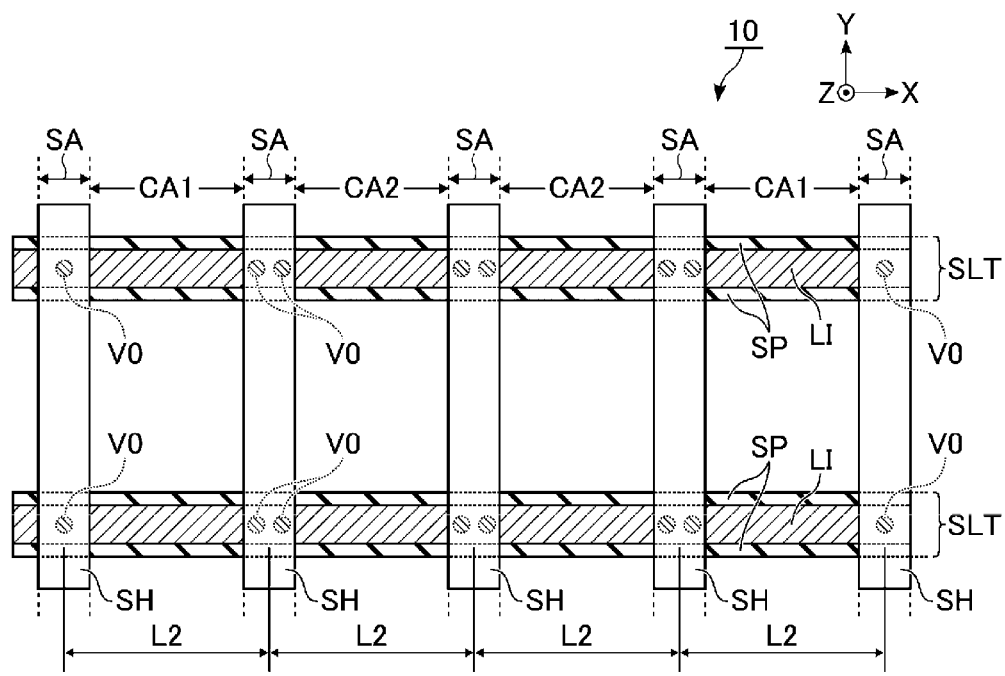
FIG. 13 is a plan view illustrating a planar layout of shunt lines in a memory cell array in a semiconductor memory device according to a first modification of the embodiment.

FIG. 13 illustrates a planar layout of the shunt lines SHs in the memory cell array 10 in the semiconductor memory device 1 according to the first modification of the embodiment. In this example, two cell areas CA2 are provided between two cell areas CA1. As illustrated in FIG. 13, in the semiconductor memory device 1 according to the first modification of the embodiment, as in the Comparative Example, the cell areas CAs are separated by the shunt areas SAs, and have substantially the same widths at the end portion side of the memory cell array 10, and at the middle portion of the memory cell array 10.

Meanwhile, in the semiconductor memory device 1 according to the first modification of the embodiment, the number of contacts V0 for the shunt line SH disposed on the end portion side of the memory cell array 10 is different from the number of contacts V0 for the shunt line SH disposed in the middle portion of the memory cell array 10.

Specifically, for example, one contact V0 is provided between the shunt line SH disposed on the end portion side of the memory cell array 10, and the contact LI in each slit SLT. Then, for example, two contacts V0 are provided between the shunt line SH disposed in the middle portion of the memory cell array 10, and the contact LI in each slit SLT.

Then, in the semiconductor memory device 1 according to the first modification of the embodiment, a contact resistance R1 between the contact LI in each slit SLT and the shunt line SH disposed on the end portion side of the memory cell array 10 is about twice a contact resistance R2 between the contact LI in each slit SLT and the shunt line SH disposed in the middle portion of the memory cell array 10. The contact resistance R1 only has to be larger than the contact resistance R2, and it is desirable that the following condition is satisfied:

$$R1 = R2 \times 2.$$

Thus, in the semiconductor memory device 1 according to the first modification of the embodiment, a difference between each of the shunt lines SHs disposed on both end sides and the shunt line SH sandwiched between two cell areas CAs, in the total amount of current flowing into the shunt line SH via the plurality of contacts V0 is smaller than that in the Comparative Example.

As a result, as in the embodiment, the semiconductor memory device 1 according to the first modification of the embodiment may narrow the width of a distribution of the threshold voltage of the memory cell transistor MT after writing. Therefore, as in the embodiment, the semiconductor memory device 1 according to the first modification of the embodiment can prevent erroneous reading, thereby improving the reliability of stored data.

In the semiconductor memory device 1 according to the first modification of the embodiment, the number of contacts C0 corresponding to the shunt line SH disposed on the end portion side of the memory cell array 10 only has to be smaller than the number of contacts C0 corresponding to the shunt line SH disposed in the middle portion of the memory cell array 10. The effect similar to that in the first modification of the embodiment may be achieved by changing the shape of the contact C0 (i.e., a sectional area in the XY plane) according to areas instead of changing the number of the contacts C0 according to areas, and thereby changing the resistance value of the contact C0.

(Second Modification of Embodiment)

Figure 14:
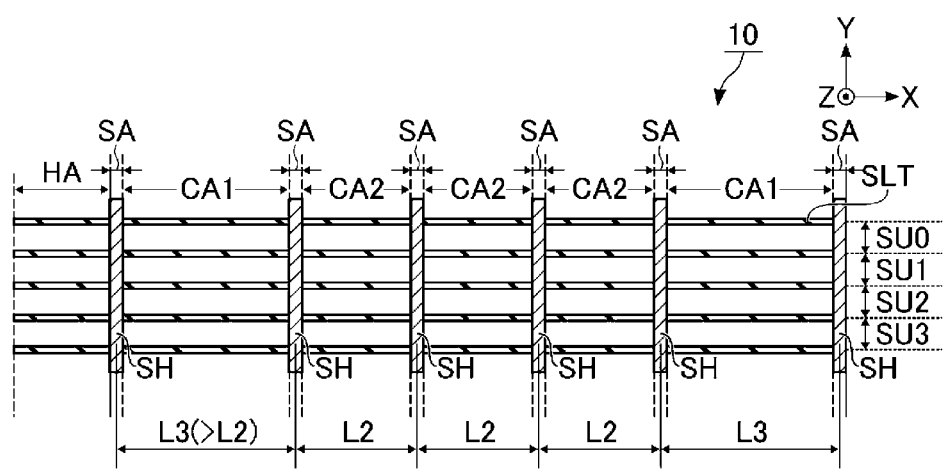
FIG. 14 is a plan view illustrating a planar layout of shunt lines in a memory cell array in a semiconductor memory device according to a second modification of the embodiment.

FIG. 14 illustrates a planar layout of the shunt lines SHs in the memory cell array 10 in the semiconductor memory device 1 according to the second modification of the embodiment. In this example, three cell areas CA2 are provided between two cell areas CA1. As illustrated in FIG. 14, in the semiconductor memory device 1 according to the first modification of the embodiment, as in the Comparative Example, the cell areas CAs are separated by the shunt areas SAs, and the width of the cell area CA1 is larger than the width of the cell area CA2.

Specifically, the interval between two shunt lines SHs adjacent to each other via the cell area CA1 is larger than the interval between two shunt lines SHs adjacent to each other via the cell area CA2. That is, an interval L3 in the X direction between center lines of the two shunt lines SHs adjacent to each other via the cell area CA1 is longer than an interval L2 in the X direction between the centers of the two adjacent shunt lines SHs.

In the semiconductor memory device 1 according to the second modification of the embodiment, the contact resistance between the contact LI in each slit SLT and the shunt line SH disposed on the end portion side of the memory cell array 10 is equal to or less than the contact resistance between the contact LI in each slit SLT and the shunt line SH disposed in the middle portion of the memory cell array 10.

Specifically, in the semiconductor memory device 1 according to the second modification of the embodiment, due to the lengths L2 and L3, and the contact resistance between the shunt line SH and the contact LI, the total amount of current flowing into the shunt line SH may be substantially uniform for each of the shunt lines SHs disposed on both end sides, and the shunt line SH sandwiched between two cell areas CAs.

As a result, as in the embodiment, the semiconductor memory device 1 according to the second modification of the embodiment may narrow the width of a threshold distribution of the memory cell transistor MT after writing. Therefore, as in the embodiment, the semiconductor memory device 1 according to the first modification of the embodiment can prevent erroneous reading, thereby improving the reliability of stored data.

[2] Other modifications, etc.

The semiconductor memory device of the embodiment includes a semiconductor layer, a first contact, a second contact, a plurality of first conductor layers, a plurality of pillars, a plurality of shunt lines, and a plurality of third contacts. The semiconductor layer includes a cell area. The first contact extends along a first direction parallel to the surface of the semiconductor layer and is provided on the semiconductor layer. The second contact extends along the first direction, is provided on the semiconductor layer, and is disposed away from the first contact in a second direction intersecting with the first direction. The plurality of first conductor layers are stacked apart from each other above the semiconductor layer between the first contact and the second contact. Each of the plurality of pillars passes through the plurality of first conductor layers and is provided on the semiconductor layer in the cell area. Portions where the pillars and the first conductor layers intersect function as memory cells. The plurality of shunt lines are provided side by side in the first direction in the cell area, and each of the shunt lines extends along the second direction. The plurality of shunt lines are electrically connected to the first contact and the second contact. The plurality of third contacts are provided between the shunt lines and the first contact, and between the shunt lines and the second contact, respectively.

A first interval in the first direction between a shunt line disposed on an end portion side in the first direction, and an end portion of the cell area in the first direction is narrower than a second interval between two adjacent shunt lines in the first direction. This may improve the reliability of data stored in the semiconductor memory device.

In the above embodiments, a boundary portion of the cell area CA uses, for example, the memory pillar MP to which the contact CV is connected, as a reference. The embodiments are not limited thereto, and an area where the bit lines BLs pass above the memory pillars MPs may be the cell area CA. The boundary portion of the cell area CA only has to use the arrangement of the memory pillars MPs as one reference. In the above embodiment, the interval of adjacent shunt lines SHs uses center lines of the shunt lines in the X direction, as a reference, while the interval of the adjacent shunt lines SHs may use other portions as a reference.

In the above embodiments, descriptions have been made on a case where in the planar layout of the memory cell array 10, a cell area and a shunt area are independently provided, while the embodiments are not limited thereto. For example, in an embodiment, the semiconductor substrate (i.e., the P-type well region 20) may include a cell area, and a plurality of shunt areas SAs may be provided in the corresponding cell area. In this case, the cell area is divided by the plurality of shunt areas SAs, and the area separated by the shunt areas SAs corresponds to the cell area CA1 or CA2 in the embodiment. In the Comparative Example, the first modification, and the second modification of the embodiment, the shunt line SH (i.e., the shunt area SA) disposed on the end portion side in the X direction may overlap the end portion of the cell area in the X direction.

In the above embodiments, descriptions have been made on a case where the memory pillar MP and the conductor layer 26 are connected via one columnar contact, the contact LI and the conductor layer 50 are connected via one columnar contact, and the conductor layers 50 and 51 are connected via one columnar contact, while the embodiments are not limited thereto. Two or more contacts connected in the Z direction may be used for each of the contacts CV, V0, and V1. When a plurality of contacts are connected in the X direction, different conductor layers may be inserted between adjacent contacts. Likewise, other contacts or conductor layers may be inserted between the contact CC and the conductor layer 40.

In the above embodiments, descriptions have been made on a case where a structure between two adjacent slits SLTs corresponds to one string unit SU, while the embodiments are not limited thereto. For example, a slit that divides the select gate line SGD may be provided between the two adjacent slits SLTs. In this case, as the string unit SU, a plurality of string units SU are formed between the two adjacent slits SLTs. The number of string units SU between the adjacent slits SLTs changes on the basis of the number of slits that divide the select gate line SGD.

In the above embodiments, the memory pillar MP may have a structure in which a plurality of pillars are connected in the Z direction. The memory pillar MP may have a structure in which a pillar corresponding to the select gate line SGD, and a pillar corresponding to the word lines WLs are connected. The number of bit lines BLs overlapping each memory pillar MP may be any number.

In the drawings used for description of the above embodiments, a case where the contacts CCs, CV, V0 and V1 have the same diameter in the Z direction is illustrated, while the embodiments are not limited thereto. For example, the memory pillar MP or each of the contacts CCs, CV, V0, and V1 may have a tapered shape or an inversely tapered shape, or may have a shape in which a middle portion is swollen. Similarly, the slit SLT may have a tapered shape or an inversely tapered shape, or may have a shape in which a middle portion is swollen. In the above embodiment, descriptions have been made on a case where the sectional structure of each of the memory pillar MP and the contacts CCs, CV, V0 and V1 is circular, while this sectional structure may be elliptical, or may have any shape.

In the present specification, the term "connect" indicates electrical connection, and does not exclude that, for example, another element is interposed between both sides. The phrase "electrically connected" may include interposition of an insulator as long as it is possible to perform an operation in the same manner as in electrical connection. The term "columnar" indicates a structure provided in a hole formed in the manufacturing process of the semiconductor memory device 1. The phrase "outer diameter" indicates a diameter of a constitutional element in a section parallel to the surface of the semiconductor substrate. The phrase "outer diameter" indicates, for example, the diameter of the outermost member among members in a hole used for forming a constitutional element. For example, when the outer diameter of a contact C4 is compared to the outer diameter of a support column HR, the outer diameters of constitutional elements in the same section are compared to each other. The phrase "both ends" in one constitutional element indicates, for example, a set of one disposed at one side end portion in the X direction, and one disposed at the other side end portion in the X direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor memory device comprising:
 a semiconductor layer including a cell area and a non-cell area adjacent to the cell area in a first direction parallel to a surface of the semiconductor layer;
 first and second conductive lines on the semiconductor layer, extending along the first direction and arranged away from each other in a second direction parallel to the surface of the semiconductor layer and crossing the first direction;
 a plurality of first conductor layers arranged above the semiconductor layer in a third direction crossing both the first and second directions;
 a plurality of pillars on the cell area, each of which passes through the first conductor layers in the third direction and forms a plurality of memory cells, one of the memory cells formed at an intersection of the pillar with one of the first conductor layers; and
 a plurality of shunt lines extending along the second direction and arranged in the first direction above the cell area, each of the shunt lines electrically connected to each of the first and second conductive lines via one or more third conductive lines, wherein
 a first length between one of the shunt lines closest to the non-cell area and a boundary between the cell and non-cell areas in the first direction is less than a second length between two of the shunt lines that are adjacent to each other.

2. The semiconductor memory device according to claim 1, wherein
the first length is about half of the second length.

3. The semiconductor memory device according to claim 1, wherein
each of the first and second conductive lines forms a part of a source line electrically connected to one of the memory cells.

4. The semiconductor memory device according to claim 1, wherein
each of the shunt lines forms a part of a source line electrically connected to one of the memory cells.

5. The semiconductor memory device according to claim 1, further comprising:
a plurality of bit lines extending along the second direction and arranged in the first direction above the cell area, wherein
each of the bit lines is electrically connected to at least one of the pillars via a fourth conductive line.

6. The semiconductor memory device according to claim 5, further comprising:
a sense amplifier electrically connected to the bit lines.

7. The semiconductor memory device according to claim 1, wherein
each of the shunt lines is electrically connected to each of the first and second conductive lines via two third conductive lines arranged along the first direction.

8. A semiconductor memory device comprising:
a semiconductor layer including a cell area and a non-cell area adjacent to the cell area in a first direction parallel to a surface of the semiconductor layer;
first and second conductive lines on the semiconductor layer, extending along the first direction and arranged away from each other in a second direction parallel to the surface of the semiconductor layer and crossing the first direction;
a plurality of first conductor layers arranged above the semiconductor layer in a third direction crossing both the first and second directions;
a plurality of pillars on the cell area, each of which passes through the first conductor layers in the third direction and forms a plurality of memory cells one of the memory cells formed at an intersection of the pillar with one of the first conductor layers; and
a plurality of shunt lines extending along the second direction and arranged in the first direction above the cell area, each of the shunt lines electrically connected to each of the first and second conductive lines via one or more third conductive lines, wherein
the plurality of shunt lines includes a first shunt line closest to the non-cell area and a second shunt line disposed in a middle portion of the cell area, and
a first number of the third conductive lines connected to the first shunt line is smaller than a second number of the third conductive lines connected to the second shunt line.

9. The semiconductor memory device according to claim 8, wherein
a resistance value between said one of the shunt lines and the first conductive line is substantially twice a resistance value between said another shunt line and the first conductive line.

10. The semiconductor memory device according to claim 8, wherein
intervals between two adjacent shunt lines are substantially equal, and
said one of the shunt lines is disposed along a boundary between the cell and non-cell areas.

11. The semiconductor memory device according to claim 8, wherein
the second number of the third conductive lines is twice the first number of the third conductive lines.

12. The semiconductor memory device according to claim 8, wherein
each of the first and second conductive lines forms a part of a source line electrically connected to one of the memory cells.

13. The semiconductor memory device according to claim 8, wherein
each of the shunt lines forms a part of a source line electrically connected to one of the memory cells.

14. The semiconductor memory device according to claim 8, further comprising:
a plurality of bit lines extending along the second direction and arranged in the first direction above the cell area, wherein
each of the bit lines is electrically connected to at least one of the pillars via a fourth conductive line.

15. The semiconductor memory device according to claim 14, further comprising:
a sense amplifier electrically connected to the bit lines.

16. A semiconductor memory device comprising:
a semiconductor layer including a cell area and a non-cell area adjacent to the cell area in a first direction parallel to a surface of the semiconductor layer;
first and second conductive lines on the semiconductor layer, extending along the first direction and arranged away from each other in a second direction parallel to the surface of the semiconductor layer and crossing the first direction;
a plurality of first conductor layers arranged above the semiconductor layer in a third direction crossing both the first and second directions;
a plurality of pillars on the cell area, each of which passes through the first conductor layers in the third direction and forms a plurality of memory cells one of the memory cells formed at an intersection of the pillar with one of the first conductor layers; and
a plurality of shunt lines extending along the second direction and arranged in the first direction above the cell area, each of the shunt lines electrically connected to each of the first and second conductive lines via one or more third conductive lines, wherein
a first interval between two adjacent shunt lines at each end of the cell area is greater than a second interval between other two adjacent shunt lines.

17. The semiconductor memory device according to claim 16, wherein
a resistance value between one of the shunt lines closest to the non-cell area and the first conductive line is equal to or less than a resistance value between another shunt line disposed between other two shunt lines and the first conductive line.

18. The semiconductor memory device according to claim 16, wherein
intervals between two adjacent shunt lines other than the two adjacent shunt lines at each end of the cell area are substantially equal, and
one of the shunt lines closest to the non-cell area is disposed along a boundary between the cell area and the non-cell area.

19. The semiconductor memory device according to claim 18, wherein
an interval between two adjacent shunt lines at one end of the cell area is substantially equal to an interval between two adjacent shunt lines at the other end of the cell area.

20. The semiconductor memory device according to claim 16, further comprising:
a plurality of bit lines extending along the second direction and arranged in the first direction above the cell area, wherein
each of the bit lines is electrically connected to at least one of the pillars via a fourth conductive line.

* * * * *

UNITED STATES PATENT AND TRADEMARK OFFICE
CERTIFICATE OF CORRECTION

PATENT NO. : 11,239,161 B2
APPLICATION NO. : 16/808211
DATED : February 1, 2022
INVENTOR(S) : Yoichi Minemura It is certified that error appears in the above-identified patent and that said Letters Patent is hereby corrected as shown below:

In the Claims

In Column 17, Claim 8, Line 45, please insert --,-- after "cells".

Signed and Sealed this
Thirteenth Day of December, 2022

Katherine Kelly Vidal
*Director of the United States Patent and Trademark Office*